US008717729B2

(12) United States Patent
Tracy et al.

(10) Patent No.: US 8,717,729 B2
(45) Date of Patent: May 6, 2014

(54) COMPUTING DEVICES HAVING FAIL-SAFE MECHANICAL SHUT-OFF SWITCH

(75) Inventors: Mark S. Tracy, Tomball, TX (US); Keith A. Sauer, Spring, TX (US); Jeffrey A. Lev, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 418 days.

(21) Appl. No.: 12/866,501

(22) PCT Filed: Feb. 12, 2008

(86) PCT No.: PCT/US2008/053654
§ 371 (c)(1),
(2), (4) Date: Aug. 6, 2010

(87) PCT Pub. No.: WO2009/102321
PCT Pub. Date: Aug. 20, 2009

(65) Prior Publication Data
US 2010/0321883 A1    Dec. 23, 2010

(51) Int. Cl.
*H02H 5/04*    (2006.01)
*H01H 37/00*    (2006.01)

(52) U.S. Cl.
USPC ................................ 361/105; 337/1; 361/760

(58) Field of Classification Search
USPC .............. 361/679.46–679.54, 688–723, 103, 361/105, 760; 337/1, 3, 362, 363
See application file for complete search history.

(56) References Cited

U.S. PATENT DOCUMENTS

| 3,066,206 | A  | * | 11/1962 | Dales ............................ 337/372 |
| 4,510,479 | A  | * | 4/1985  | Merchant ........................ 337/91 |
| 4,620,175 | A  | * | 10/1986 | Karr et al. ..................... 337/343 |
| 4,795,997 | A  | * | 1/1989  | Fisher et al. ................... 337/380 |
| 4,959,860 | A  | * | 9/1990  | Watters et al. .................. 726/19 |
| 5,402,099 | A  | * | 3/1995  | Ballard et al. ................. 337/298 |
| 5,623,597 | A  | * | 4/1997  | Kikinis .......................... 726/18 |
| 5,804,798 | A  | * | 9/1998  | Takeda ......................... 219/511 |
| 5,892,428 | A  | * | 4/1999  | Hsu ............................... 337/363 |
| 5,936,510 | A  | * | 8/1999  | Wehl et al. ..................... 337/377 |
| 6,100,784 | A  | * | 8/2000  | Hofsass ......................... 337/343 |
| 6,121,868 | A  | * | 9/2000  | Chiang ........................... 337/37 |
| 6,184,768 | B1 | * | 2/2001  | Hsu ............................... 337/363 |
| 6,205,010 | B1 |   | 3/2001  | Ohsaka et al. |
| 6,281,780 | B1 | * | 8/2001  | Sugiyama et al. ............ 337/137 |
| 6,396,381 | B1 | * | 5/2002  | Takeda ......................... 337/377 |
| 6,496,346 | B1 | * | 12/2002 | Bruckner ....................... 361/103 |
| 6,771,159 | B2 | * | 8/2004  | Ramahi et al. ................ 337/379 |
| 7,149,907 | B2 | * | 12/2006 | McAfee et al. ............... 713/300 |
| 7,203,049 | B2 | * | 4/2007  | Chu et al. ...................... 361/105 |
| 7,808,361 | B1 | * | 10/2010 | Yu ................................. 337/14 |
| 8,274,355 | B2 | * | 9/2012  | Jun ............................... 337/104 |

(Continued)

FOREIGN PATENT DOCUMENTS

KR    10-2006-0024040    3/2006
KR    10-2006-0134421    12/2006

OTHER PUBLICATIONS

International Searching Authority, International Search Report and Written Opinion dated Oct. 17, 2008, pp. 9.

*Primary Examiner* — Adrian S Wilson

(57) ABSTRACT

In one embodiment, a computing device includes a circuit board having a heat-generating component and a mechanical shut-off switch configured to cut power to the heat-generating component when a temperature within the computing device rises above a threshold temperature.

23 Claims, 2 Drawing Sheets

(56) References Cited

U.S. PATENT DOCUMENTS

| | | | |
|---|---|---|---|
| 2001/0041969 A1* | 11/2001 | Murdock et al. | 702/132 |
| 2002/0038550 A1* | 4/2002 | Gillen | 62/3.7 |
| 2002/0075648 A1* | 6/2002 | Nakagawa et al. | 361/690 |
| 2003/0117253 A1* | 6/2003 | Rinaldi et al. | 337/167 |
| 2003/0123206 A1* | 7/2003 | Gower et al. | 361/93.8 |
| 2004/0027799 A1* | 2/2004 | King et al. | 361/687 |
| 2004/0042142 A1 | 3/2004 | Ikeda | |
| 2004/0201077 A1* | 10/2004 | Momohara | 257/499 |
| 2005/0103613 A1* | 5/2005 | Miller | 200/400 |
| 2006/0250209 A1* | 11/2006 | Yu | 337/36 |
| 2007/0109752 A1* | 5/2007 | Xiao et al. | 361/724 |
| 2007/0135105 A1* | 6/2007 | Bitou | 455/414.1 |
| 2008/0154536 A1* | 6/2008 | McMillan et al. | 702/132 |
| 2008/0256350 A1* | 10/2008 | Hattori et al. | 713/1 |

\* cited by examiner

COMPUTING DEVICES HAVING FAIL-SAFE MECHANICAL SHUT-OFF SWITCH

BACKGROUND

Various components generate heat within computing devices, such as server computers, desktop computers, notebook computers, and game consoles. Most such computing devices comprise internal fans that are activated by software of the device as the temperature of the heat-generating components, or the interior space in which those components are contained, rises above a given threshold. As the temperature continues to rise, the fan speed is increased. If temperatures rise further beyond an established limit, other actions, such as throttling of the device's processors, are performed in an effort to reduce operating temperatures. When all such measures fail to reduce the temperature to an acceptable level, the computing device may automatically shut down to prevent permanent damage.

Although the above actions can be effective at reducing heat within a computing device and protecting the device from damage, each action is software driven and, therefore, software dependent. Specifically, software, such as the device operating system, often controls operation of the fan, throttling of the processors, and ultimate shut down. Therefore, when that software is not operating correctly, for example due to a glitch or lock-up, such cooling and protective measures may not be taken. If the heat-generating components of the computing device continue to operate when the software is disabled, the computing device can be damaged. Such damage may comprise failure of one or more internal components. In more extreme cases, damage to external components of the device can occur. For example, if a notebook computer experiences a lock-up and is placed within an insulating enclosure, such as a carry-on bag, it is possible for temperatures to rise to levels at which the keyboard keys or the device housing will melt.

BRIEF DESCRIPTION OF THE DRAWINGS

The disclosed computing devices can be better understood with reference to the following drawings. The components in the drawings are not necessarily to scale.

DETAILED DESCRIPTION

As described above, damage can occur to a computing device when its software is unable to control the device to perform various actions intended to reduce operating temperatures. As described in the following, however, such damage can be reduced or avoided by providing the computing device with a fail-safe mechanical shut-off switch that automatically cuts power to the heat-generating components of the computing device when a given threshold temperature is exceeded. In such a case, operation of the computing device will be interrupted even if the software that controls the fan, processor throttling, and automatic shutdown is unable to do so for some reason.

Figure 1:
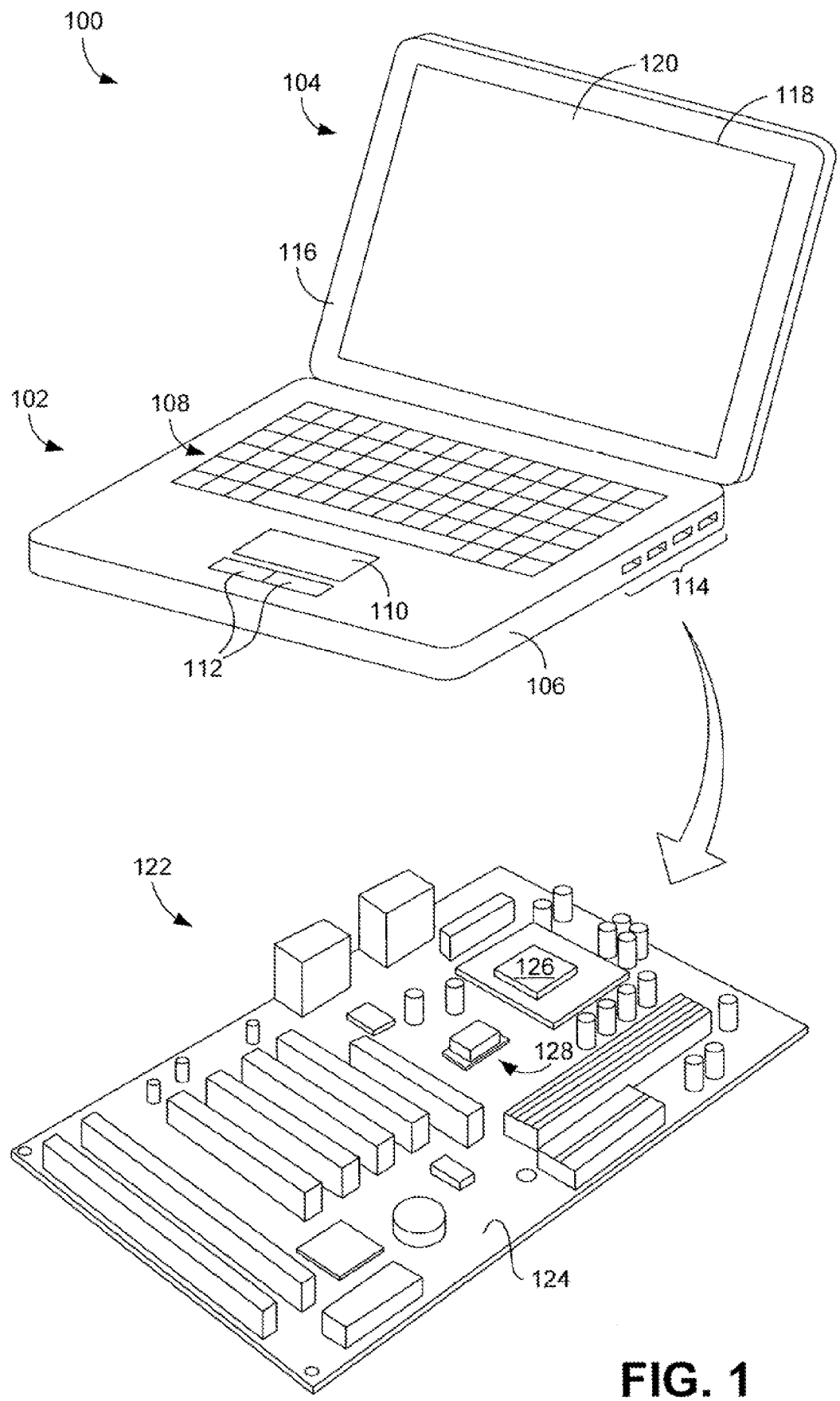
FIG. 1 is a perspective view of an embodiment of a computing device and a circuit board comprised by the computing device that incorporates a mechanical shut-off switch.

Referring now in more detail to the drawings in which like numerals indicate corresponding parts throughout the views, FIG. 1 illustrates a computing device 100 in the form of a notebook or "laptop" computer. Although a notebook computer has been explicitly illustrated and identified, it is noted that the notebook computer is cited only as an example. Therefore, the teachings of the present disclosure equally apply to other computing devices that comprise internal components that generate heat, such as server computers, desktop computers, and game consoles.

As indicated in FIG. 1, the computing device 100 includes a base portion 102 and a display portion 104 that are attached to each other with a hinge mechanism (not shown). The base portion 102 includes an outer housing 106 that surrounds various internal components of the computing device 100, such as a processor, memory, hard drive, and the like. Also included in the base portion 102 are user input devices, including a keyboard 108, a mouse pad 110, and selection buttons 112, as well as various ports or connectors 114 that are accessible through the housing 106.

The display portion 102 includes its own outer housing 116. Formed within the housing 116 is an opening 118 through which a display device 120 may be viewed. In some embodiments, the display device 120 comprises a liquid crystal display (LCD).

As is further depicted in FIG. 1, the computing device 100 comprises a circuit board 122. In some embodiments, the circuit board 122 comprises a motherboard of the computing device. The circuit board 122 comprises a mounting surface 124 to which various components are mounted. Several of those components are heat-generating components, meaning that they generate relatively large amounts of heat during their operation.

In the embodiment of FIG. 1, the circuit board 122 at least comprises a processor 126, which may comprise a central processing unit (CPU) of the computing device. In addition, the circuit board 122 comprises a fail-safe mechanical shut-off switch 128. As indicated in FIG. 1, the shut-off switch 128 is directly mounted to the surface 124 of the circuit board 122, for example in close proximity to the processor 126, which may comprise the component that generates the most heat on the circuit board. In some embodiments, the shut-off switch 128 comprises a bimetallic thermostat. For example, the shut-off switch 128 can comprise a bimetallic strip formed from two bonded strips of metal having different coefficients of thermal expansion. In such a case, the bimetallic strip will deform and separate from an internal contact to open the switch when the bimetallic strip reaches a specific threshold temperature. By way of example, that threshold temperature is in the range of approximately 70° C. to 100° C. Examples of such switches are available from Portage Electric Products, Inc. (PEPI).

Figure 2:
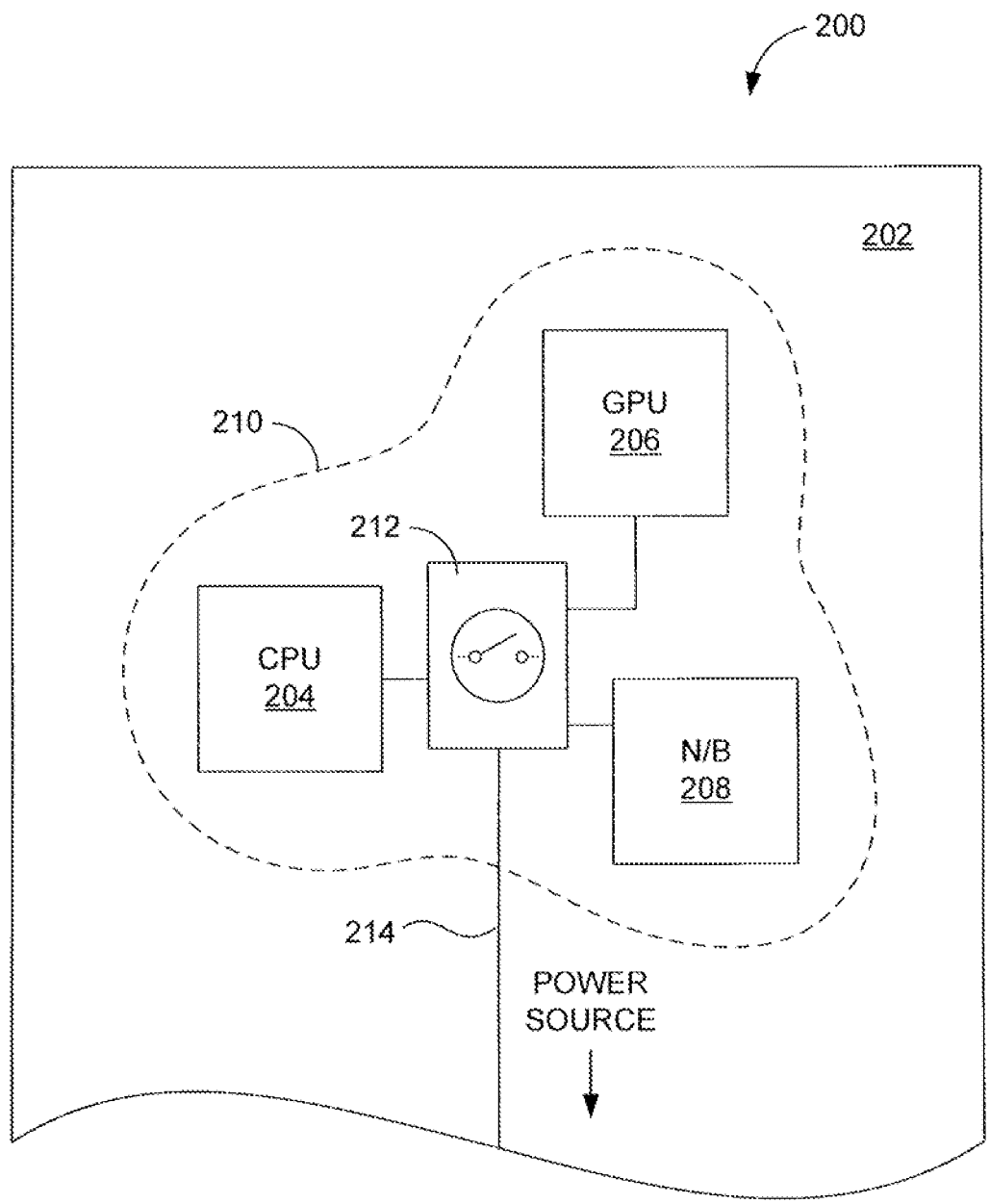
FIG. 2 is a schematic view of a further circuit board that incorporates a mechanical shut-off switch.

The shut-off switch 128 is connected to power lines (e.g., conductive traces) that lead to heat-generating components of the computing device 100, including the processor 126. By way of example, the shut-off switch 128 is connected in line along the power rail of the circuit board 112. Such an arrangement is depicted in FIG. 2, which illustrates a further circuit board 200. The circuit board 200, which also may comprise a computing device motherboard, includes a mounting surface 202 to which various heat-generating components are mounted, including a CPU 204, a graphics processing unit (GPU) 206, and a north bridge (N/B) 208 of the chip set Those components may be said to form a "hot zone" 210 of the circuit board 200 at which the majority of the heat is produced by the circuit board.

Strategically placed within the center of the hot zone 210 is a fail-safe mechanical shut-off switch 212. As indicated in FIG. 2, the shut-off switch 212 is connected in line with a power rail 214 that is formed on or within the circuit board 200. The power rail 214 is used to provide power from a power source, such as an internal battery or external alternating current (AC) source, to each of the components 204, 206, and 208. Because the shut-off switch 212 is positioned in line with the power rail 214, however, opening of the switch results in power no longer being supplied to the components 204, 206, and 208.

As with the mechanical shut-off switch 128, the mechanical shut-off switch 212 is configured to automatically open when the ambient temperature within the hot zone 210 exceeds a predetermined threshold temperature. Therefore, if one or more of the components 204, 206, and 208 continue to operate after a software lock-up occurs, the shut-off switch 212 will operate to cut power to all of those components if the temperature within the hot zone exceeds the threshold. Once the temperature falls below the threshold, however, the shut-off switch 212 will close to again enable the components 204, 206, and 208 to be powered.

Although the disclosed mechanical shut-off switches have been described as being used to cut power when the temperature of heat-generating components within a computing device exceeds a threshold, the mechanical shut-off switches can alternatively be used to restrict use of the computing device in certain environments. For example, a mechanical shut-off switch having a lower activation temperature could be provided within the computing device outside of the hot zone such that, if the temperature of the environment in which a user is attempting to use the computing device is too high (e.g., above 40° C.), the switch can operate to prevent such use in an effort to prevent device damage.

The invention claimed is:

1. A computing device comprising:
    a circuit board having a mounting surface;
    a central processing unit mounted to the mounting surface;
    a graphics processing unit mounted to the mounting surface; and
    a mechanical shut-off switch mounted to the mounting surface of the circuit board between the central processing unit and the graphics processing unit, the mechanical shutoff switch being configured to concurrently cut power to the central processing unit and the graphics processing unit when a temperature within the computing device rises above a threshold temperature.

2. The computing device of claim 1, wherein the mechanical shut-off switch comprises a bimetallic thermostat.

3. The computing device of claim 1, wherein the mechanical shut-off switch is connected to a power rail of the circuit board.

4. The computing device of claim 1, wherein the mechanical shut-off switch is configured to open at a temperature in the range of approximately 70° C. to 100° C.

5. The computing device of claim 1, wherein the mechanical shut-off switch is configured to close once the temperature within the computing device falls below the threshold temperature.

6. The computing device of claim 1, wherein the computing device comprises a notebook computer.

7. A computing device comprising:
    a motherboard having a mounting surface;
    heat-generating components mounted to the mounting surface, the heat-generating components including a central processing unit and a graphics processing unit;
    a power rail formed on or in the motherboard configured to supply power to each of the central processing unit and the graphics processing unit; and
    a mechanical shut-off switch mounted to the mounting surface between the central processing unit and the graphics processing unit and connected in line with the power rail, the shut-off switch being configured to be open when a temperature in the computing device is above a threshold temperature to concurrently cut power to both the central processing unit and the graphics processing unit and to be closed when the temperature is below the threshold temperature, wherein power can be supplied to the heat-generating components via the power rail when the shut-off switch is closed but cannot be supplied to the heat-generating components via the power rail when the shut-off switch is open.

8. The computing device of claim 7, wherein the mechanical shut-off switch comprises a bimetallic thermostat.

9. The computing device of claim 7, wherein the mechanical shut-off switch is configured to open at a temperature in the range of approximately 70° C. to 100° C.

10. The computing device of claim 1, wherein the computing device comprises a notebook computer.

11. A circuit board for use in a computing device, the circuit board comprising:
    a mounting surface;
    a central processing unit mounted to the mounting surface;
    a graphics processing unit mounted to the mounting surface;
    a power rail formed on or in the circuit board configured to supply power to the central processing unit and the graphics processing unit; and
    a mechanical shut-off switch mounted to the mounting surface between the central processing unit and the graphics processing unit and connected in line with the power rail, the shut-off switch being configured to concurrently cut power to both the central processing unit and the graphics processing unit when a temperature within the computing device rises above a threshold temperature.

12. The circuit board of claim 11, wherein the mechanical shut-off switch comprises a bimetallic thermostat.

13. The circuit board of claim 11, wherein the mechanical shut-off switch is configured to open at a temperature in the range of approximately 70° C. to 100° C.

14. The circuit board of claim 11, wherein the mechanical shut-off switch is configured to close once the temperature within the computing device falls below the threshold temperature.

15. The computing device of claim 2, wherein the bimetallic thermostat is configured to automatically move from an open position in which power to the central processing unit and the graphics processing unit is cut to a closed position in response to the temperature within the computing device falling below the threshold temperature.

16. The computing device of claim 8, wherein the bimetallic thermostat is configured to automatically move from an open position in which power to the central processing unit and the graphics processing unit is cut to a closed position in response to the temperature within the computing device falling below the threshold temperature.

17. The circuit board of claim 12, wherein the bimetallic thermostat is configured to automatically move from an open position in which power to the central processing unit and the graphics processing unit is cut to a closed position in response to the temperature within the computing device falling below the threshold temperature.

18. The computing device of claim 1 further comprising a processor mounted to the mounting surface, wherein the mechanical shutoff switch is configured to automatically cut power to the central processing unit and the graphics processing unit in response to the temperature within the computing device rising above the threshold temperature, independent of the processor and after disablement of software driven automatic shutdown of the heat generating component.

19. The computing device of claim 18, wherein the mechanical shutoff switch is configured to automatically move from an open position in which power to the central processing unit and the graphics processing unit is cut to a closed position independent of the processor in response to the temperature within the computing device falls below the threshold temperature.

20. The computing device of claim 7 further comprising a processor mounted to the mounting surface, wherein the mechanical shutoff switch is configured to (A) automatically cut power to the central processing unit and the graphics processing unit in response to the temperature within the computing device rising above the threshold temperature, independent of the processor and (B) automatically move from an open position in which power to the central processing unit and the graphics processing unit is cut to a closed position independent of the processor in response to the temperature within the computing device falling below the threshold temperature.

21. The computing device of claim 1 further comprising a Northbridge memory controller mounted to the circuit board, wherein the mechanical shutoff switch is mounted to the mounting surface between the Northbridge memory controller, the central processing unit and the graphics processing unit and wherein the mechanical shutoff switch is configured to concurrently cut power to each of the Northbridge memory controller, the central processing unit in the graphics processing unit in response to the temperature within the computing device rising above the threshold temperature.

22. The computing device of claim 7 further comprising a Northbridge memory controller mounted to the motherboard, wherein the mechanical shutoff switch is mounted to the mounting surface between the Northbridge memory controller, the central processing unit and the graphics processing unit and wherein the mechanical shutoff switch is configured to concurrently cut power to each of the Northbridge memory controller, the central processing unit in the graphics processing unit in response to the temperature within the computing device rising above the threshold temperature.

23. The circuit board of claim 11 further comprising a Northbridge memory controller mounted to the circuit board, wherein the mechanical shutoff switch is mounted to the mounting surface between the Northbridge memory controller, the central processing unit and the graphics processing unit and wherein the mechanical shutoff switch is configured to concurrently cut power to each of the Northbridge memory controller, the central processing unit in the graphics processing unit in response to the temperature within the computing device rising above the threshold temperature.

* * * * *